United States Patent
Tomiha et al.

(10) Patent No.: US 10,168,400 B2
(45) Date of Patent: Jan. 1, 2019

(54) MAGNETIC RESONANCE IMAGING APPARATUS INCLUDING RF SHIELD INCLUDING SLITS

(71) Applicant: Toshiba Medical Systems Corporation, Otawara-shi (JP)

(72) Inventors: Sadanori Tomiha, Nasushiobara (JP); Yoshitomo Sakakura, Nasushiobara (JP); Kazuya Okamoto, Saitama (JP); Takahiro Ishihara, Otawara (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 457 days.

(21) Appl. No.: 14/855,717

(22) Filed: Sep. 16, 2015

(65) Prior Publication Data

US 2016/0091576 A1 Mar. 31, 2016

(30) Foreign Application Priority Data

Sep. 26, 2014 (JP) .................................. 2014-197625

(51) Int. Cl.
*G01R 33/34* (2006.01)
*G01R 33/422* (2006.01)

(52) U.S. Cl.
CPC ..... *G01R 33/34076* (2013.01); *G01R 33/422* (2013.01)

(58) Field of Classification Search
CPC .............. G01R 33/34076; G01R 33/42; G01R 33/422
See application file for complete search history.

(56) References Cited

U.S. PATENT DOCUMENTS

| 4,642,569 | A | | 2/1987 | Hayes et al. | |
|---|---|---|---|---|---|
| 5,276,398 | A | * | 1/1994 | Withers | G01R 33/34 324/318 |
| 5,396,173 | A | * | 3/1995 | Sakakura | G01R 33/422 324/318 |
| 5,592,087 | A | * | 1/1997 | Richard | G01R 33/422 324/318 |
| 6,285,189 | B1 | * | 9/2001 | Wong | G01R 33/34046 324/318 |

(Continued)

FOREIGN PATENT DOCUMENTS

| JP | 3-50543 | 8/1991 |
|---|---|---|
| JP | 8-238230 A | 9/1996 |
| JP | 2011-87904 | 5/2011 |

OTHER PUBLICATIONS

Office Action dated May 29, 2018 in Japanese Patent Application No. 2014-197625.

*Primary Examiner* — Jay Patidar

(74) *Attorney, Agent, or Firm* — Oblon, McClelland, Maier & Neustadt, L.L.P.

(57) ABSTRACT

A magnetic resonance imaging apparatus according to an embodiment includes an RF coil and an RF shield. The RF coil is formed in a substantially cylindrical shape. The RF shield is formed in a substantially cylindrical shape and is disposed on an outer circumferential side of the RF coil. The RF shield is provided with a plurality of slits that are in a form of a line extending in an axial direction and having an asymmetrical length in the axial direction with respect to a center in the axial direction and are disposed so as to alternately switch positions thereof in the axial direction along a circumferential direction.

10 Claims, 7 Drawing Sheets

(56) References Cited

U.S. PATENT DOCUMENTS

| | | | | |
|---|---|---|---|---|
| 7,397,244 B2* | 7/2008 | Cirel | ................... | G01R 33/422 |
| | | | | 324/318 |
| 7,834,626 B2* | 11/2010 | Renz | ................. | G01R 33/3415 |
| | | | | 324/318 |
| 8,022,705 B2* | 9/2011 | Bogdanov | ........ | G01R 33/34046 |
| | | | | 324/318 |
| 2006/0001425 A1* | 1/2006 | Weyers | ............ | G01R 33/34046 |
| | | | | 324/318 |
| 2010/0033185 A1* | 2/2010 | Saha | ............... | G01R 33/34076 |
| | | | | 324/318 |
| 2011/0074419 A1* | 3/2011 | Sakakura | ........... | G01R 33/3854 |
| | | | | 324/318 |
| 2012/0169340 A1* | 7/2012 | Leussler | ............... | G01R 33/341 |
| | | | | 324/309 |
| 2015/0005616 A1* | 1/2015 | Saha | ................... | G01R 33/422 |
| | | | | 600/411 |
| 2015/0212174 A1* | 7/2015 | Brown | ................. | G01R 33/422 |
| | | | | 324/322 |

* cited by examiner

MAGNETIC RESONANCE IMAGING APPARATUS INCLUDING RF SHIELD INCLUDING SLITS

CROSS-REFERENCE TO RELATED APPLICATIONS

This application is based upon and claims the benefit of priority from Japanese Patent Application No. 2014-197625, filed on Sep. 26, 2014; the entire contents of which are incorporated herein by reference.

FIELD

An embodiment described herein relates generally to a magnetic resonance imaging apparatus.

BACKGROUND

Conventionally, in magnetic resonance imaging apparatuses, a radio frequency (RF) shield may be provided to block off an RF magnetic field generated from an RF coil toward a gradient coil side. On the RF shield, it is known that an eddy current is induced by a gradient magnetic field applied from the gradient coil. This eddy current may provide causes of image deterioration.

DETAILED DESCRIPTION

A magnetic resonance imaging apparatus according to an embodiment includes an RF coil and an RF shield. The RF coil is formed in a substantially cylindrical shape. The RF shield is formed in a substantially cylindrical shape and is disposed on an outer circumferential side of the RF coil. The RF shield is provided with a plurality of slits that are in a form of a line extending in an axial direction and having an asymmetrical length in the axial direction with respect to a center in the axial direction and are disposed so as to alternately switch positions thereof in the axial direction along a circumferential direction.

With reference to the accompanying drawings, the following describes the MRI apparatus in the embodiment.

Figure 1:
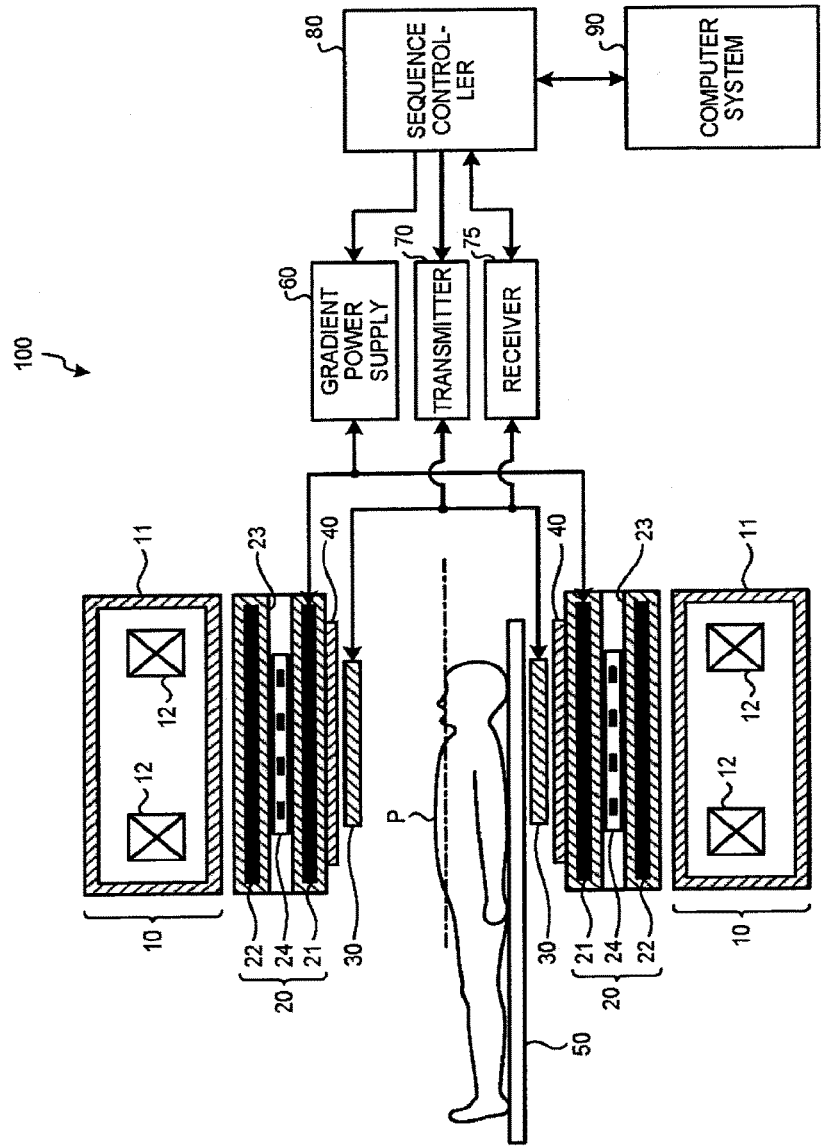
FIG. 1 is a block diagram illustrating an example of the configuration of an MRI apparatus according to an embodiment.

FIG. 1 is a block diagram illustrating the configuration of an MRI apparatus 100 in the embodiment. As illustrated in FIG. 1, the MRI apparatus 100 includes a static field magnet 10, a gradient coil 20, an RF coil 30, an RF shield 40, a couchtop 50, a gradient power supply 60, a transmitter 70, a receiver 75, a sequence controller 80, and a computer system 90, for example.

The static field magnet 10 is a magnet formed in a substantially cylindrical shape (including the one for which the cross-section orthogonal to the axis of cylinder is in an elliptical shape), and generates a static magnetic field inside a bore that is a void space formed inside the cylinder. The static field magnet 10 is a superconducting magnet, and includes a vacuum vessel 11, and a superconducting coil 12 that is immersed in coolant inside the vacuum vessel 11, for example.

The gradient coil 20 is formed in a substantially cylindrical shape (including the one for which the cross-section orthogonal to the axis of cylinder is in an elliptical shape), and is disposed on the inner circumferential side of the static field magnet 10. The gradient coil 20 is an actively shielded gradient coil (ASGC) and includes a main coil 21 and a shield coil 22, for example. The main coil 21 applies to a subject P a gradient magnetic field for which the intensity in the directions of an X axis, a Y axis, and a Z axis is varied by an electric current supplied from the gradient power supply 60. The shield coil 22 blocks off the gradient magnetic field generated by the main coil 21 by generating a magnetic field on the outside of the main coil 21 by the current supplied from the gradient coil 20.

Between the main coil 21 and the shield coil 22, a plurality of shim-tray insertion guides 23 are formed, for example. The shim-tray insertion guide 23 is a through-hole forming openings on both end faces of the gradient coil 20, and is formed extending over the entire length of the gradient coil 20 in the longitudinal direction, for example. The shim-tray insertion guides 23 are formed in the area sandwiched by the main coil 21 and the shield coil 22 so as to be in parallel with one another and equally spaced apart in the circumferential direction.

In the shim-tray insertion guide 23, inserted is a shim tray 24 housing iron shims that correct non-uniformity in static magnetic field inside the bore. In the shim tray 24, a given number of iron shims are housed. The shim tray 24 is fixed near the middle of the gradient coil 20 inside the shim-tray insertion guide 23.

The RF coil 30 is formed in a substantially cylindrical shape (including the one for which the cross-section orthogonal to the axis of cylinder is in an elliptical shape), and is disposed on the inner circumferential side of the gradient coil 20. The RF coil 30 applies, based on radio frequency (RF) pulses transmitted from the transmitter 70, an RF magnetic field to the subject P. Furthermore, the RF coil 30 receives a magnetic resonance signal emitted from the subject P by the excitation of hydrogen nuclei.

The RF shield 40 is formed in a substantially cylindrical shape (including the one for which the cross-section orthogonal to the axis of cylinder is in an elliptical shape), and is disposed between the gradient coil 20 and the RF coil 30. The RF shield 40 blocks off the RF magnetic field generated by the RF coil 30. The specific configuration of the RF shield 40 will be described later in detail.

The respective static field magnet 10, the gradient coil 20, the RF coil 30, and the RF shield 40 formed in a substantially cylindrical shape are supported by a gantry device not depicted, and the respective positions thereof are fixed. At this time, the static field magnet 10, the gradient coil 20, the RF coil 30, and the RF shield 40 are disposed such that the positions of the respective axes (the dashed-dotted line indicated in FIG. 1) and the positions of the respective centers coincide with one another. The positions of the axes of the static field magnet 10, the gradient coil 20, the RF coil 30, and the RF shield 40, and the positions of the centers thereof, however, do not necessarily need to coincide with one another.

The couchtop 50 is provided on a couch device not depicted and is supported to be movable in an up-down direction, a left-right direction, and a front-back direction. When image capturing of the subject P is performed, the couchtop 50 is moved to the inside of the bore of the static field magnet 10 while the subject P is placed thereon. The gradient power supply 60 supplies the current to the gradient coil 20 based on instructions from the sequence controller 80.

The transmitter 70 transmits RF pulses to the RF coil 30 based on instructions from the sequence controller 80. The receiver 75 detects the magnetic resonance signal received by the RF coil 30 and transmits raw data, which is the digitized detected magnetic resonance signal, to the sequence controller 80.

The sequence controller 80 performs, under the control of the computer system 90, a scan of the subject P by driving the respective gradient power supply 60, the transmitter 70, and the receiver 75. When the raw data is subsequently transmitted from the receiver 75 as a result of having performed the scan, the sequence controller 80 then transmits the raw data to the computer system 90.

The computer system 90 controls a whole of the MRI apparatus 100. For example, the computer system 90 receives an input of an image capturing condition from an operator via an input unit and, based on the received image capturing condition, makes the sequence controller 80 perform a scan. Furthermore, the computer system 90 reconstructs an image from the raw data transmitted from the sequence controller 80, and displays the reconstructed image on a display unit.

Under such a configuration, the MRI apparatus 100 in the embodiment has a configuration to reduce the influence of eddy current induced on the RF shield 40. Specifically, the RF shield 40 is configured to include a plurality of slits that are formed at asymmetrical positions with respect to the center in the axial direction. More specifically, on the RF shield 40, a plurality of slits in a form of a line extending in the axial direction and having an asymmetrical length in the axial direction with respect to the center in the axial direction are disposed so as to alternately switch the positions thereof in the axial direction along the circumferential direction.

The slit here does not necessarily mean the one that runs through an object. As described later, in the embodiment, the RF shield 40 includes a plurality of conductor layers, and on each of the conductor layers, the slit is formed to run through between the inner circumferential surface and the outer circumferential surface. However, by displacing the positions of slits of the respective conductor layers, each of the slits is made not to run through between the inner circumferential surface and the outer circumferential surface of the RF shield 40 as a whole.

It is generally known that, on the RF shield, an eddy current is induced by the gradient magnetic field applied from the gradient coil. This eddy current may provide causes of image deterioration. Hence, it is desirable that the RF shield be arranged such that the eddy current is not induced as much as possible. For example, as a method to suppress the eddy current, there is a method of segmenting the eddy current induced on the RF shield by providing slits on the RF shield. In the RF shield, however, the shielding performance of RF magnetic field is deteriorated by forming the slits, and thus the slits cannot be provided randomly. Furthermore, depending on the position of the slit provided, there may be a case that the eddy current cannot be segmented effectively.

Meanwhile, in the embodiment, on the RF shield 40, a plurality of slits are formed at asymmetrical positions with respect to the center in the axial direction. More specifically, on the RF shield 40, a plurality of slits in a form of a line extending in the axial direction and having an asymmetrical length in the axial direction with respect to the center in the axial direction are disposed so as to alternately switch the positions thereof in the axial direction along the circumferential direction. According to this configuration, on the RF shield 40, the slits are to be disposed being dispersed in the axial direction. Consequently, the pathway through which the eddy current flows along the circumferential direction of the RF shield 40 can be lengthened, and thus the eddy current can be made harder to be induced.

In the following description, with reference to FIGS. 2 to 8, the configuration of the MRI apparatus 100 in the embodiment will be explained in detail with a focus on the configuration of the RF shield 40.

Figure 2:
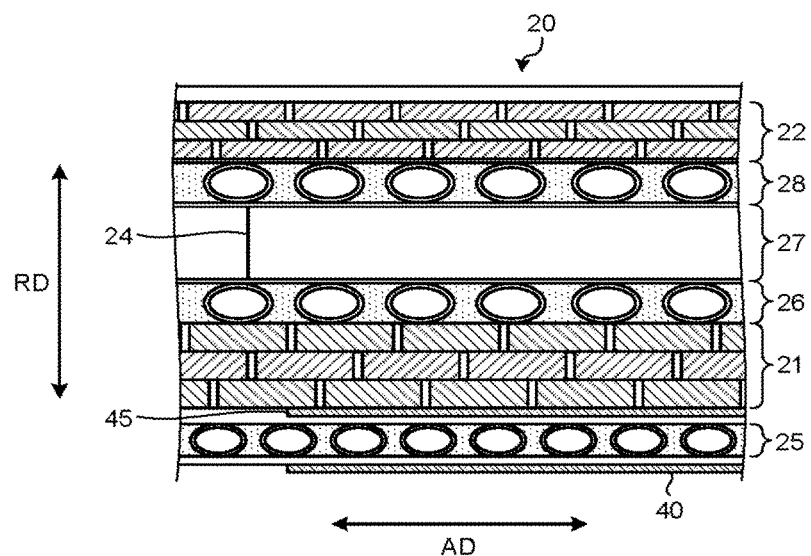
FIG. 2 is a cross-sectional view illustrating the configuration of a gradient coil in the embodiment.

FIG. 2 is a cross-sectional view illustrating the configuration of the gradient coil 20 in the embodiment. FIG. 2 illustrates a part of the cross-section of the gradient coil 20 along the axial direction (direction of a two-way arrow AD indicated in FIG. 2). The upper side portion illustrated in FIG. 2 represents an outer side portion of the gradient coil 20 in the radial direction (direction of a two-way arrow RD indicated in FIG. 2), and the lower side illustrated in FIG. 2 represents an inner side portion of the gradient coil 20 in the radial direction.

For example, as illustrated in FIG. 2, the gradient coil 20 is formed by stacking respective layers, from the inner side toward the outer side in the radial direction, in the order of a first cooling layer 25, the main coil 21, a second cooling layer 26, a shim-tray insertion guide layer 27, a third cooling layer 28, and the shield coil 22.

In each of the first cooling layer 25, the second cooling layer 26, and the third cooling layer 28, arranged is a cooling tube spirally formed with the axis of the gradient coil 20 as the center. In the cooling tube of the respective cooling layers, refrigerants supplied from a given chiller are running. Consequently, the refrigerants circulate inside the gradient coil 20, and the gradient coil 20 is cooled. In the shim-tray insertion guide layer 27, a plurality of shim trays 24 in each of which a plurality of iron shims are housed are disposed.

On the inner circumferential side of the first cooling layer 25, the RF shield 40 illustrated in FIG. 1 is disposed. Although the depiction is omitted in FIG. 1, between the first cooling layer 25 and the main coil 21, an RF shield 45 is further disposed. Each of the RF shields blocks off the RF magnetic field generated toward the gradient coil 20 side from the RF coil 30 that is disposed on the inner circumferential side of the gradient coil 20. In the following description, the RF shield 40 will be explained in detail. In the embodiment, however, the RF shield 45 also has the same configuration as that of the RF shield 40.

The RF shield 40 is disposed so as to be in a state of being attached to the inner circumferential surface of the gradient coil 20. For example, at the time the gradient coil 20 is manufactured, the RF shield 40 and the RF shield 45 are disposed on the inner side of a plurality of conductor patterns of the gradient coil 20, and are fixed by resin impregnated in the peripheries of the respective conductor patterns. At this time, the RF shield 40 is positioned so as to cover a whole of the RF coil 30.

Figure 3:
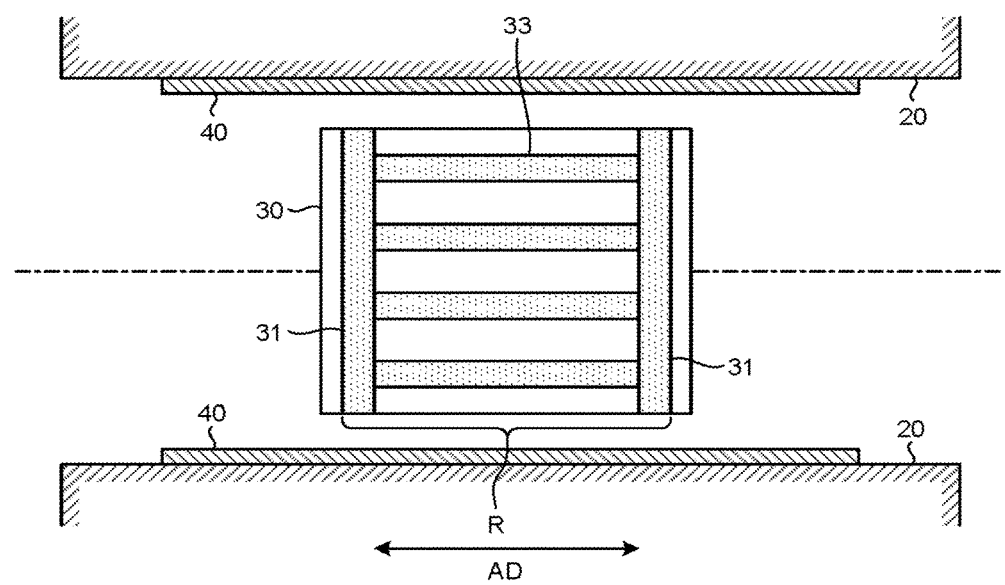
FIG. 3 is a diagram illustrating the configuration of an RF coil and the positional relation between the RF coil and an RF shield in the embodiment.

FIG. 3 is a diagram illustrating the configuration of the RF coil 30 and the positional relation between the RF coil 30 and the RF shield 40 in the embodiment. For example, as illustrated in FIG. 3, the RF coil 30 is disposed such that the position of the axis (the dashed-dotted line indicated in FIG. 3) and the position of the center in the axial direction (direction of a two-way arrow AD indicated in FIG. 3) coincide with those of the gradient coil 20 and the RF shield 40. The positions of the axes of the gradient coil 20, the RF coil 30, and the RF shield 40, and the positions of the centers thereof, however, do not necessarily need to coincide with one another.

In the embodiment, the RF coil 30 is a birdcage-type coil and includes, as conductor patterns, two rings 31 and a plurality of rungs 33. The rings 31 are disposed near both ends of the RF coil 30 in the axial direction. The rungs 33 are disposed so as to extend over the rings 31 at substantially equal intervals along the circumferential direction of the RF coil 30. The range R indicated in FIG. 3 represents a range in which the conductor patterns are disposed on the RF coil 30 in the axial direction.

In the embodiment, the RF shield 40 is constructed by electrically connecting substrates of three layers in which a single substrate of dielectric layer is sandwiched by two substrates of conductor layer.

Figure 4:
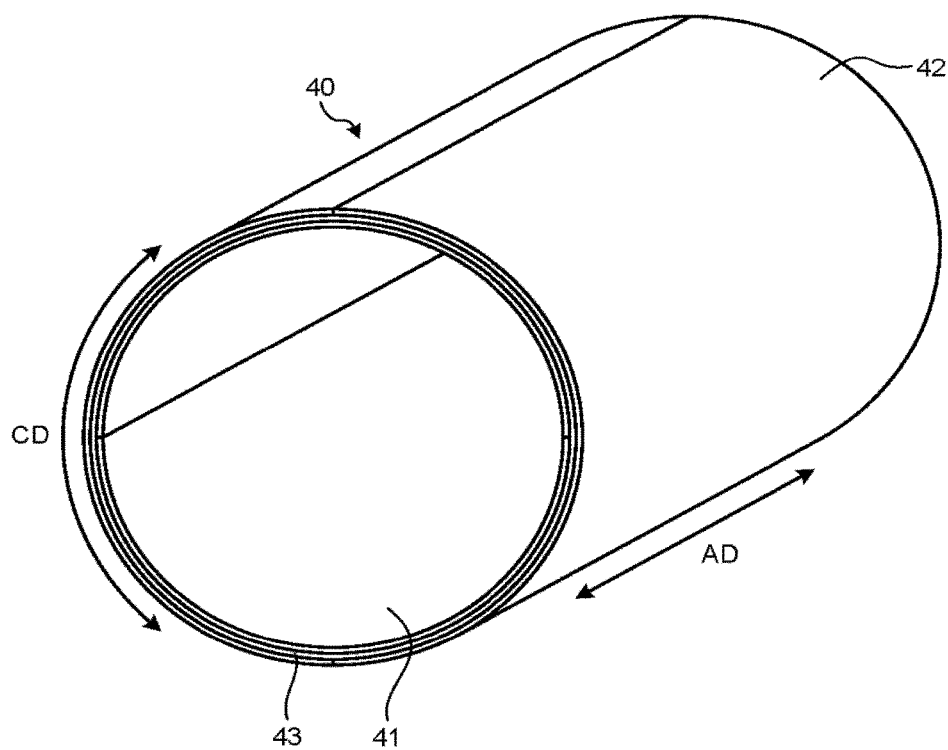
FIG. 4 is an external view illustrating the configuration of the RF shield in the embodiment.

FIG. 4 is an external view illustrating the configuration of the RF shield 40 in the embodiment. For example, as illustrated in FIG. 4, the RF shield 40 includes substrates 41 and 42 of conductor layer and a substrate 43 of dielectric layer, each of which is formed in a substantially cylindrical shape. The RF shield 40 is formed by stacking the respective substrates, from the inner side toward the outer side in the radial direction, in the order of the substrate 41 of conductor layer, the substrate 43 of dielectric layer, and the substrate 42 of conductor layer.

In the following description, the configuration of the RF shield 40 will be explained in detail. However, as mentioned earlier, the RF shield 45 illustrated in FIG. 2 has the same configuration as that of the RF shield 40. That is, the RF shield 45 is also constructed by electrically connecting substrates of three layers in which a single substrate of dielectric layer is sandwiched by two substrates of conductor layer.

In the embodiment, as illustrated in FIG. 4, the substrates 41 and 42 of conductor layer are each composed of two members that are divided along the circumferential direction (direction of a two-way arrow CD indicated in FIG. 4). For example, the substrates 41 and 42 of conductor layer are disposed such that the positions of cut lines of the two members of the respective substrates are displaced from each other at approximately 90 degrees in the circumferential direction.

The RF shield 40 further includes a plurality of slits that are formed at asymmetrical positions with respect to the center in the axial direction. More specifically, on the RF shield 40, a plurality of slits in a form of a line extending in the axial direction and having an asymmetrical length in the axial direction with respect to the center in the axial direction are disposed so as to alternately switch the positions thereof in the axial direction along the circumferential direction.

For example, on the RF shield 40, the slits are each formed at a length shorter than the length of the RF shield 40 in the axial direction. The slits include the slits being disposed close to an end portion on one side of the RF shield 40 and the slits being disposed close to an end portion on the other side of the RF shield 40. The slits are formed at asymmetrical positions with respect to a plane that runs through the center of the axis of the RF shield 40 and is orthogonal to the axis. In the following description, the slits asymmetrically formed in this manner are referred to as first slits.

As in the foregoing, in the embodiment, the substrates 41 and 42 of conductor layer are each composed of two members divided along the circumferential direction.

Figure 5:
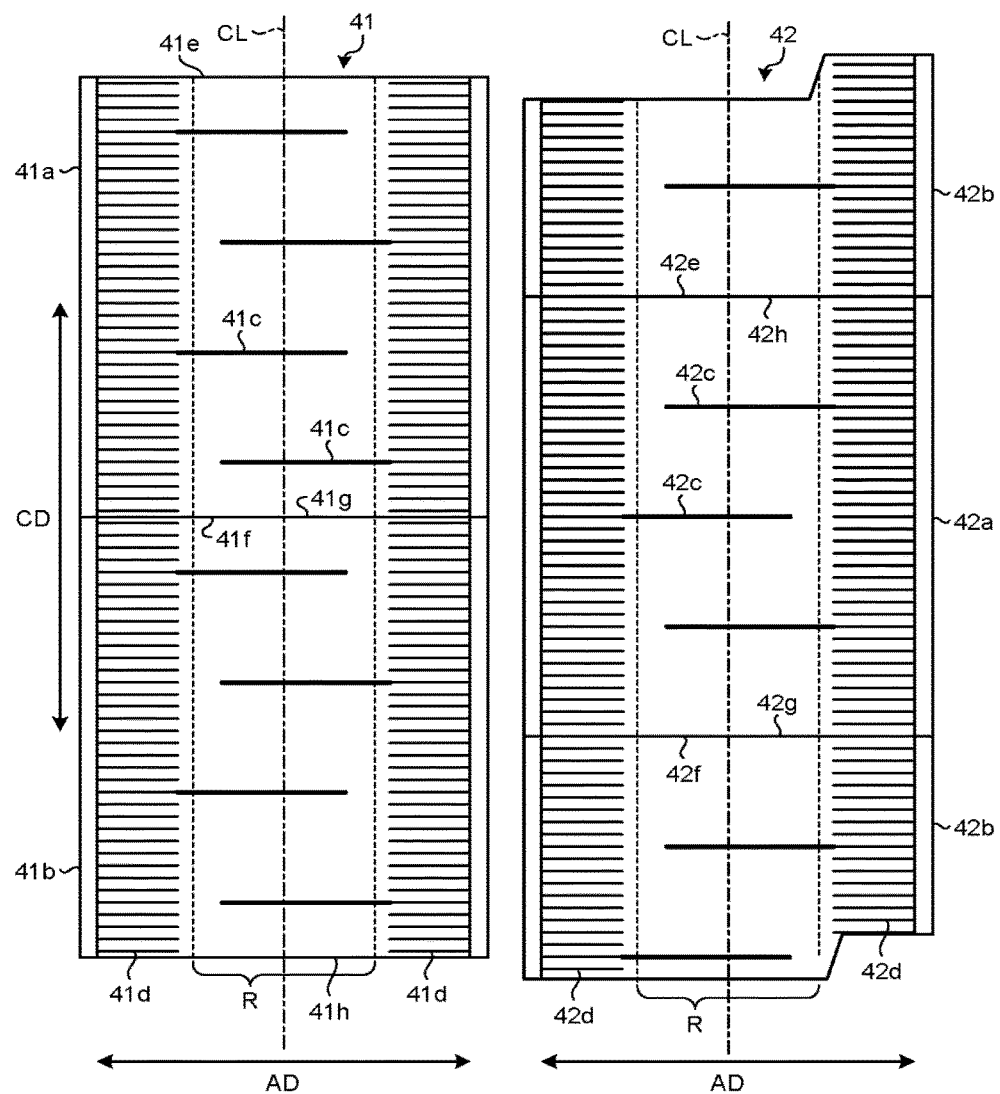
FIG. 5 is a development view illustrating the configuration of substrates of conductor layer of the RF shield in the embodiment.

FIG. 5 is a development view illustrating the configuration of the substrates 41 and 42 of conductor layer of the RF shield 40 in the embodiment. FIG. 5 illustrates a situation in which the cylindrically formed substrates 41 and 42 of conductor layer are each spread out in a flat plate shape and are, by aligning the positions thereof in the circumferential direction (direction of a two-way arrow CD indicated in FIG. 5), juxtaposed in the axial direction (direction of two-way arrows AD indicated in FIG. 5).

For example, as illustrated in FIG. 5, the substrate 41 includes a member 41a and a member 41b, and the substrate 42 includes a member 42a and a member 42b. In FIG. 5, although the member 42b is illustrated being separated into two parts, in the member 42b, the upper end of the portion illustrated on the upper side in FIG. 5 and the lower end of the portion illustrated on the lower side are continuous. The ranges R indicated in FIG. 5 represent the range in which the conductor patterns are disposed on the RF coil 30 in the axial direction. The lengths of the ranges R in the axial direction are the same as that of the range R indicated in FIG. 3.

In the substrate 41, the portion between an end portion 41e of the member 41a on one side in the circumferential direction and an end portion 41h of the member 41b on one side in the circumferential direction is electrically connected. Furthermore, the portion between an end portion 41f of the member 41a on the other side in the circumferential direction and an end portion 41g of the member 41b on the other side in the circumferential direction is also electrically connected. In contrast, in the substrate 42, the portion between an end portion 42e of the member 42a on one side in the circumferential direction and an end portion 42h of the member 42b on one side in the circumferential direction is not electrically connected but functions as a slit. Furthermore, the portion between an end portion 42f of the member 42a on the other side in the circumferential direction and an end portion 42g of the member 42b on the other side in the circumferential direction is not electrically connected but functions as a slit.

As illustrated in FIG. 5, on the substrate 41, a plurality of first slits 41c are formed at asymmetrical positions with respect to the center in the axial direction, for example. More specifically, on the substrate 41, a plurality of slits having an asymmetrical length in the axial direction with respect to the center in the axial direction of the RF shield 40 are disposed so as to alternately switch the positions thereof in the axial direction along the circumferential direction of the RF shield 40. The dashed-dotted lines CL indicated in FIG. 5 represent the positions at which a plane that runs through the center of the axis of the RF shield 40 and is orthogonal to the axis intersects with the respective substrates 41 and 42. The first slits 41c are formed at asymmetrical positions with respect to this position.

Furthermore, the first slits 41c are each formed in parallel with the axis of the RF shield 40, for example. The first slits 41c, however, do not necessarily need to be in parallel with the axis of the RF shield 40, and may be formed at an angle with respect to the direction that is in parallel with the axis of the RF shield 40.

The first slits 41c are disposed at substantially equal intervals along the circumferential direction of the RF shield 40, and are disposed so as to switch the positions of the respective slits in the axial direction of the RF shield 40 along the circumferential direction of the RF shield 40, for example.

Specifically, the first slits 41c are disposed so as to alternately switch the positions thereof in the axial direction of the RF shield 40 along the circumferential direction of the RF shield 40. For example, the positions of the respective slits are arranged such that the positions of the slits in the axial direction alternately switch one by one along the circumferential direction. That is, the first slits 41c are disposed so as to be displaced alternately in the axial direction along the circumferential direction of the RF shield 40.

The term of "being disposed so as to alternately switch" is not limited to mean "being disposed so as to alternately switch one by one." That is, the first slits 41c are not limited to the case of being disposed so as to switch positions one by one, and may be disposed so as to switch positions by a plurality of numbers such as two by two or three by three.

The first slits 41c are disposed at substantially equal intervals along the circumferential direction of the RF shield 40, and are disposed so as to switch the positions of the respective slits in the axial direction of the RF shield 40 along the circumferential direction of the RF shield 40, for example. For example, the positions of the respective slits are arranged so as to alternately switch the positions thereof in the axial direction one by one along the circumferential direction. That is, the first slits 41c are disposed so as to be displaced alternately in the axial direction along the circumferential direction of the RF shield 40.

The first slits 41c are each formed at a length shorter than the length of the RF shield 40 in the axial direction. That is, the first slits 41c are not formed to cut across the RF shield 40 in the axial direction, but are formed such that at least an end portion on one side does not segment the RF shield 40 in the circumferential direction. As a result, the first slits 41c are to be disposed at positions close to the end portion on one side of the RF shield 40 in the axial direction or at positions close to the end portion on the other side of the RF shield 40 in the axial direction. Consequently, the first slits 41c are to be formed at asymmetrical positions with respect to a plane that runs through the center of the axis of the RF shield 40 and is orthogonal to the axis.

In the embodiment, the RF shield 40 is configured such that the length in the axial direction is longer than the range in which the conductor patterns are disposed on the RF coil 30, and at the portion facing that range, at least a part of the respective first slits is formed.

For example, as illustrated in FIG. 5, the substrates 41 and 42 of conductor layer of the RF shield 40 are each configured to be longer than the range R in which the conductor patterns are formed on the RF coil 30. Then, the first slits 41c formed on the substrate 41 are each formed such that at least a part thereof is included on the inner side of the range R.

The respective first slits 41c are formed to segment the substrate 41 in the circumferential direction at the position of the end portion on one side out of both end portions of the range R in the axial direction while those are formed not to segment the substrate 41 in the circumferential direction at the position of the end portion on the other side. Then, the first slits 41c are disposed so as to alternately switch the end portions of non-segmenting side out of both end portions of the range R in the axial direction along the circumferential direction of the RF shield 40.

Both end portions of the range R in the axial direction here means the positions at which the rings 31 of the RF coil 30 are disposed. That is, the respective first slits 41c are formed to segment the substrate 41 in the circumferential direction at the position facing the ring 31 on one side out of the two rings 31 provided near both end portions of the RF coil 30 while those are formed not to segment the substrate 41 in the circumferential direction at the position facing the ring 31 on the other side. Then, the first slits 41c are disposed so as to alternately switch the rings 31 of non-segmenting side along the circumferential direction of the RF shield 40. Consequently, the pathway through which eddy current flows can be maximally lengthened while keeping the shielding performance of RF magnetic field in the peripheries of the rings 31 at which the RF magnetic field is intensely generated, whereby the eddy current to be induced can further be reduced.

As in the foregoing, the RF shield 40 reduces the number of slits at portions facing the rings of the birdcage-type RF coil by disposing the slits having an asymmetrical length in the axial direction with respect to the center in the axial direction so as to alternately switch the positions thereof in the axial direction along the circumferential direction. That is, the RF shield 40 can reduce the number of slits at the portions facing the rings, as compared with the case of being provided with slits extending over both portions facing the respective two rings of the birdcage-type RF coil, for example.

Furthermore, in the embodiment, the RF shield 40 further includes second slits 41d formed on the outside of the portions facing the range R in which the conductor patterns are disposed on the RF coil 30. For example, the second slits 41d are formed at equal intervals along the circumferential direction of the RF shield 40. On the outside of the range R in which the conductor patterns are disposed on the RF coil 30, the gradient coil 20 frequently varies, whereby an eddy current is notably induced. Consequently, by further providing the second slits 41d in this manner on the outside of the range R in which the conductor patterns are disposed on the RF coil 30, an eddy current to be induced on the RF shield 40 can further be reduced. The number, the length, and the disposed intervals of the second slits 41d are not necessarily limited to those illustrated in FIG. 5.

As just described, the substrate 41 has been explained. However, in the embodiment, as illustrated in FIG. 5, on the substrate 42 also, a plurality of first slits 42c are formed at asymmetrical positions with respect to the center in the axial direction and a plurality of second slits 42d are formed on the outside of the portion facing the range R in which the conductor patterns are disposed on the RF coil 30.

Furthermore, the arrangement of slits on the substrate 41 illustrated in FIG. 5 and the arrangement of slits on the substrate 42 may be replaced with each other, for example.

In the embodiment, the above-described two substrates 41 and 42 of conductor layer are disposed such that a slit formed on the substrate on one side is positioned at substantially the middle of two adjacent slits formed on the substrate on the other side.

Figure 6:
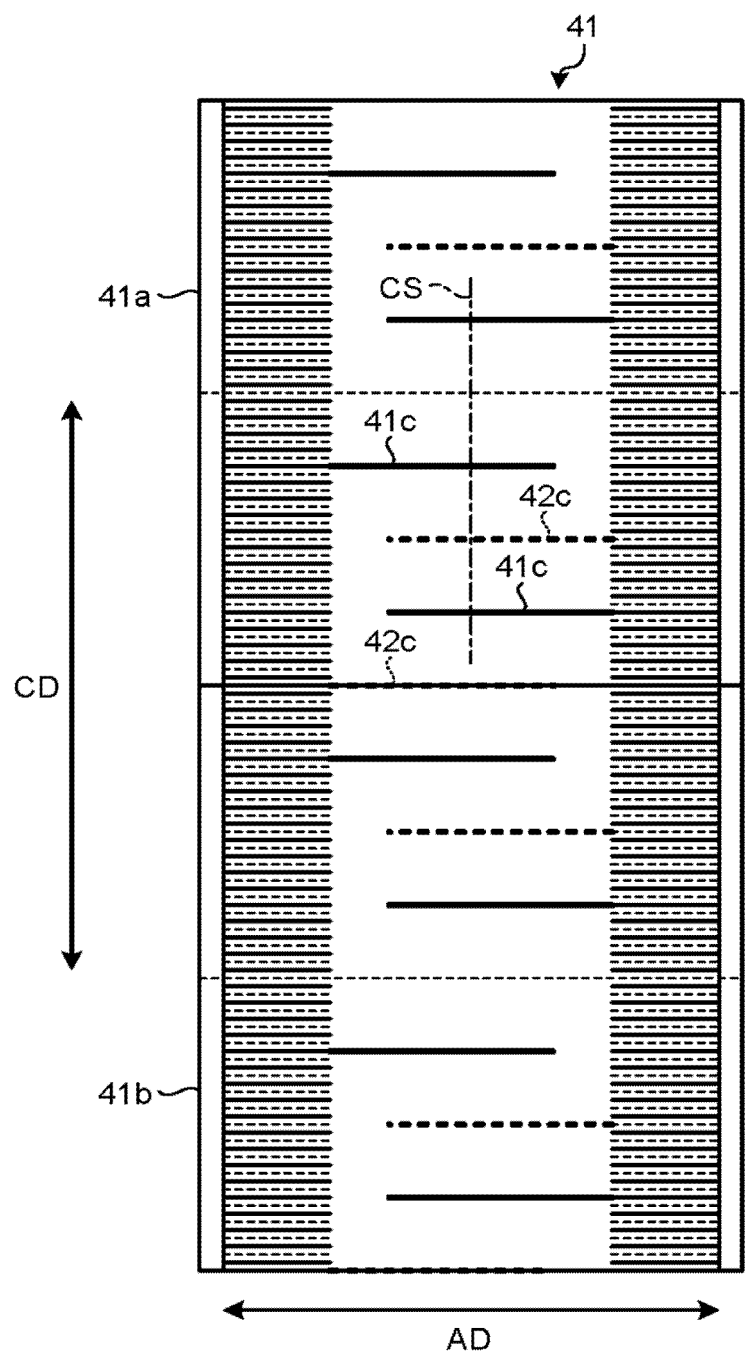
FIG. 6 is a development view illustrating the positional relation of the substrates of conductor layer of the RF shield in the axial direction and the circumferential direction in the embodiment.

FIG. 6 is a development view illustrating the positional relation of the substrates 41 and 42 of conductor layer of the RF shield 40 in the axial direction and the circumferential direction in the embodiment. FIG. 6 illustrates a situation in which the cylindrically formed substrates 41 and 42 of conductor layer are each spread out in a flat plate shape and are, by aligning the positions thereof in the circumferential direction (direction of a two-way arrow CD indicated in FIG. 6), arranged such that the substrate 42 is on the rear side of the substrate 41. In FIG. 6, the positions of the slits formed on the substrate 42 are represented by broken lines.

As in the foregoing, in the substrate 41, the portion between the end portion of the member 41a on one side in the circumferential direction and the end portion of the member 41b on one side in the circumferential direction, and the portion between the end portion of the member 41a on the other side in the circumferential direction and the end portion of the member 41b on the other side in the circumferential direction are both electrically connected. In the substrate 42, the portion between the end portion of the member 42a on one side in the circumferential direction and the end portion of the member 42b on one side in the circumferential direction, and the portion between the end portion of the member 42a on the other side in the circumferential direction and the end portion of the member 42b on the other side in the circumferential direction are not electrically connected and both function as slits.

For example, as illustrated in FIG. 6, the respective positions of the substrates 41 and 42 of conductor layer in the axial direction (direction of a two-way arrow AD in FIG. 6) and in the circumferential direction are determined such that the positions of the respective first slits 41c formed on the substrate 41 are arranged between two adjacent first slits 42c with respect to the first slits 42c formed on the substrate 42.

The positional relation of the first slits between the substrates 41 and 42 of conductor layer is not necessarily limited to that illustrated in FIG. 6. For example, the first slits formed on the substrate on one side may not be positioned at substantially the middle of two adjacent first slits formed on the substrate on the other side, but may be disposed between the two first slits at a position displaced in the circumferential direction from the middle. Furthermore, the relation with which the positions of the first slits in the axial direction which are formed on the substrate 41 and the substrate 42 are switched therebetween along the circumferential direction is not necessarily limited to that illustrated in FIG. 6.

In the embodiment, the substrates 41 and 42 of conductor layer, after being disposed such that the positions of the respective first slits 41c formed on the substrate 41 are arranged between the two adjacent first slits 42c formed on the substrate 42, are electrically connected sandwiching the substrate 43 of dielectric layer.

Figure 7:
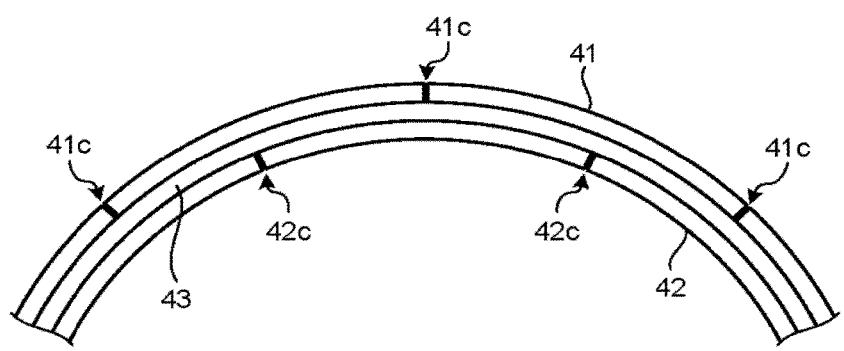
FIG. 7 is a cross-sectional view illustrating a connection state of the substrates of conductor layer of the RF shield in the embodiment.

FIG. 7 is a cross-sectional view illustrating a connection state of the substrates 41 and 42 of conductor layer of the RF shield 40 in the embodiment. FIG. 7 illustrates, on the substrate 41, the cross-section of the position indicated by the dashed-dotted line CS in FIG. 6.

For example, as illustrated in FIG. 7, the substrates 41 and 42 of conductor layer are positioned such that the positions of the respective first slits 41c formed on the substrate 41 are arranged between two adjacent first slits 42c with respect to the first slits 42c formed on the substrate 42. That is, the substrates 41 and 42 of conductor layer are disposed such that the positions of the respective slits are displaced in the circumferential direction of the RF shield 40.

By such an arrangement, the portion in which the substrates 41 and 42 of conductor layer are overlapped and are sandwiching the substrate 43 of dielectric layer is to function as a capacitive element. Consequently, because the RF shield 40 can be in a state of low impedance, that is, a state close to a conducting state, with respect to a given frequency even when the slits are provided on the RF shield 40, the shielding performance of RF magnetic field can be retained. Meanwhile, because the RF shield 40 is in a state close to insulation with respect to a low-frequency current close to a direct current, an eddy current can be restrained from being induced on the RF shield 40.

In the embodiment, a plurality of first slits of the RF shield 40 are disposed according to the positions of the conductor patterns of the birdcage-type coil so as to avoid the positions facing the respective conductor patterns as much as possible.

Figure 8:
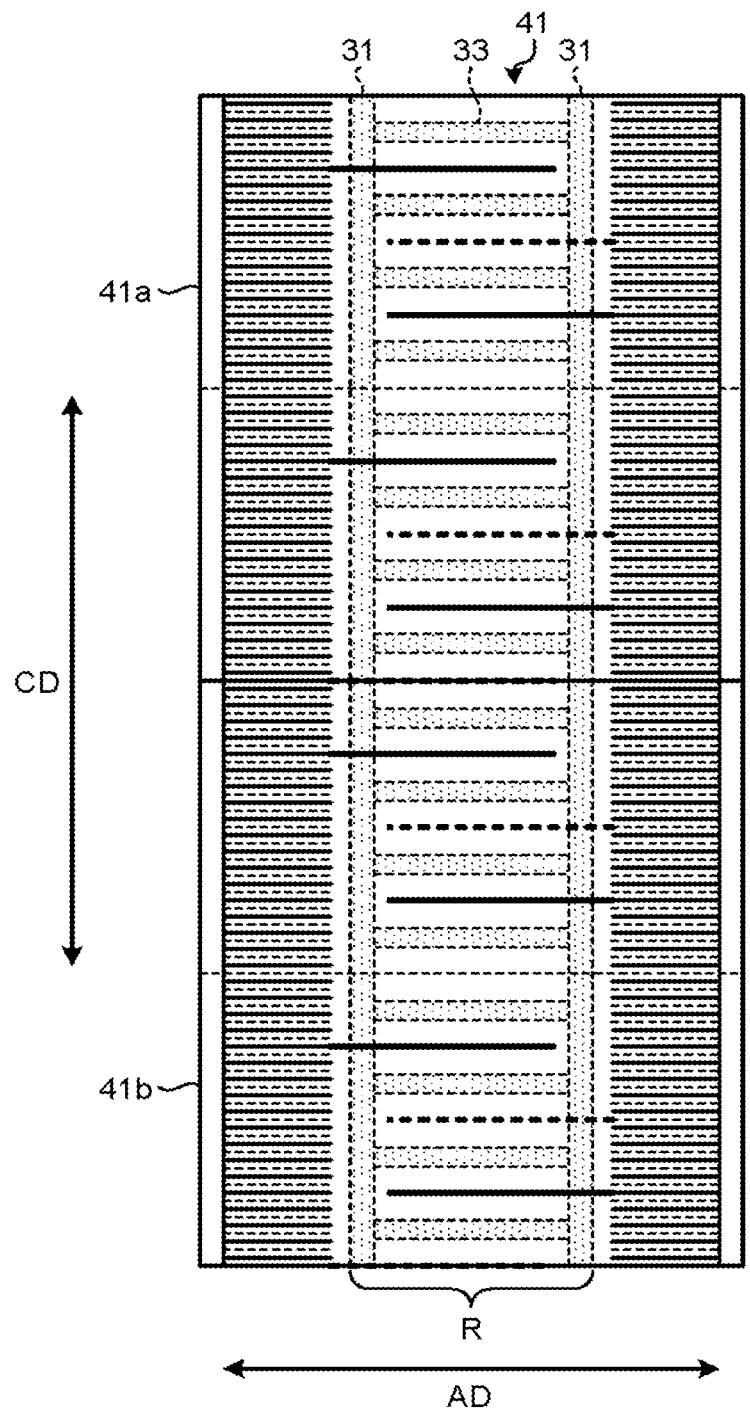
FIG. 8 is a development view illustrating the positional relation between slits, which are formed on the RF shield, and the RF coil in the embodiment.

FIG. 8 is a development view illustrating the positional relation between the slits, which are formed on the RF shield 40, and the RF coil 30 in the embodiment. FIG. 8 is a diagram illustrating, on the development view illustrated in FIG. 6, the respective positions facing the rings 31 and the rungs 33 of the RF coil 30.

For example, as in the foregoing, the respective first slits are formed to segment the substrate 41 in the circumferential direction at the position facing the ring 31 on one side out of the two rings 31 provided on the RF coil 30 while those are formed not to segment the substrate 41 in the circumferential direction at the position facing the ring 31 on the other side. The first slits 41c are then disposed so as to alternately switch the rings 31 of non-segmenting side along the circumferential direction of the RF shield 40.

As a result, as illustrated in FIG. 8, in the RF shield 40, the portion in which the substrate of conductor layer is continuous is to lie continuously as moving in the circumferential direction (direction of a two-way arrow CD in FIG. 8) while turning around in opposite directions along the axial direction (direction of a two-way arrow AD in FIG. 8), for example. Consequently, the pathway through which eddy current flows inside the RF shield 40 can be lengthened.

Furthermore, a plurality of first slits of the RF shield 40 are disposed at positions between two adjacent rungs of the birdcage-type coil. For example, as illustrated in FIG. 8, in the RF shield 40, either the first slits 41c of the substrate 41 or the first slits 42c of the substrate 42 are disposed at the respective positions between the rungs 33 of the RF coil 30.

As just described, by disposing the first slits at the respective positions between the rungs 33 of the RF coil 30, the pathway through which eddy current flows can be maximally lengthened while keeping the shielding performance of RF magnetic field in the peripheries of the rungs 33 at which the RF magnetic field is intensely generated, whereby an eddy current to be induced can further be reduced.

The number of the first slits of the RF shield 40 formed is the same as that of the rungs of the birdcage-type coil, for example. The number of the first slits here is the sum of the number of the first slits 41c formed on the substrate 41 and the number of the first slits 42c formed on the substrate 42. This number also includes the number of slits formed as the cut lines of the members 42a and 42b constituting the substrate 42. For example, as illustrated in FIG. 8, when the RF coil 30 includes 16 pieces of the rungs 33, a total of 16 slits are formed on the substrates 41 and 42.

The number of the first slits formed on the RF shield 40 is not necessarily limited to those illustrated in FIGS. 5, 6, and 8. For example, the number of the first slits formed may be less than that of the rungs of the birdcage-type coil. Reducing the number of the slits can heighten the shielding performance of the RF shield 40. The length of the first slits, the disposed intervals, and the positions in the axial direction are not necessarily limited to those illustrated in FIGS. 5, 6, and 8.

As in the foregoing, in the MRI apparatus 100 in the embodiment, the RF shield 40 is configured to include a plurality of slits that are formed at asymmetrical positions with respect to the center in the axial direction. More specifically, on the RF shield 40, a plurality of slits in a form of a line extending in the axial direction and having an asymmetrical length in the axial direction with respect to the center in the axial direction are disposed so as to alternately switch the positions thereof in the axial direction along the circumferential direction.

According to this configuration, on the RF shield 40, the slits are to be disposed being dispersed in the axial direction. Consequently, the pathway through which eddy current flows along the circumferential direction of the RF shield 40 can be lengthened, and thus the eddy current can be made harder to be induced.

In the embodiment, the MRI apparatus 100 has been exemplified to include two pieces of the RF shields 40 and 45. The embodiment, however, is not limited to this. For example, the MRI apparatus 100 may include only one of the RF shields 40 and 45. In the gradient coil 20, there may be a case in which the first cooling layer 25 located on the innermost circumferential side is not provided, for example. In such a case, at the position of the RF shield 45 illustrated in FIG. 2, only a single piece of the RF shield 45 having the configuration described in the embodiment may be disposed.

In the embodiment, the RF shield 40 and the RF shield 45 have been exemplified to have the same configuration. The embodiment, however, is not limited to this. For example, both of the first slits and the second slits may be formed on the RF shield on one side while only the second slits may be formed on the RF shield on the other side. Furthermore, both of the first slits and the second slits may be formed on the RF shield on one side while only the first slits may be formed on the RF shield on the other side, for example. That is, on the RF shield on the other side, only one of the first slits and the second slits may be formed. Moreover, no slits may be formed on the RF shield on one side while the slits may be formed only on the RF shield on the other side.

In the embodiment, the examples of a birdcage-type coil for a whole body and of the RF shield associated therewith have been described. The embodiment, however, is not limited to this. For example, the above-described embodiment can be applied in the same manner to a transmission coil for a local area and to an RF shield associated therewith.

According to at least one of the embodiments in the foregoing, an influence of eddy current induced on the RF shield can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a birdcage-type RF coil formed in a substantially cylindrical shape; and
an RF shield formed in a substantially cylindrical shape and disposed on an outer circumferential side of the RF coil, wherein
the RF shield includes a plurality of slits, the slits extending to an area between two rings of the RF coil along an axial direction, all the slits being provided so as not to overlap the slits with a rung of the RF coil in a radial view.

2. The magnetic resonance imaging apparatus according to claim 1, wherein the RF shield is configured such that a length thereof in the axial direction is longer than a range in which conductor patterns are disposed on the RF coil, and at least a part of the slits is formed at a portion facing the range.

3. The magnetic resonance imaging apparatus according to claim 1, wherein the slits are disposed at substantially equal intervals along the circumferential direction.

4. The magnetic resonance imaging apparatus according to claim 1, wherein the RF shield is constructed by electrically connecting substrates of three layers in which a single substrate of dielectric layer is sandwiched by two substrates of conductor layer.

5. The magnetic resonance imaging apparatus according to claim 4, wherein the two substrates of conductor layer are disposed such that a slit formed on the substrate on one side is positioned at substantially a middle of two adjacent slits formed on the substrate on the other side.

6. The magnetic resonance imaging apparatus according to claim 1, further comprising, other than the RF shield, an additional RF shield constructed by electrically connecting substrates of three layers in which a single substrate of dielectric layer is sandwiched by two substrates of conductor layer.

7. The magnetic resonance imaging apparatus according to claim 1, wherein
the slits are disposed at positions between two adjacent rungs of the RF coil.

8. The magnetic resonance imaging apparatus according to claim 7, wherein number of the formed slits is same as or less than number of the rungs of the birdcage-type coil.

9. The magnetic resonance imaging apparatus according to claim 1, wherein the RF shield is formed such that a length thereof in the axial direction is longer than a range in which conductor patterns are disposed on the RF coil, and further includes second slits formed on outside of a portion facing the range.

10. A magnetic resonance imaging apparatus comprising:
a birdcage-type RF coil formed in a substantially cylindrical shape; and
an RF shield formed in a substantially cylindrical shape and disposed on an outer circumferential side of the RF coil, wherein
the RF shield includes a plurality of first slits, the first slits extending to an area between two rings of the RF coil along an axial direction, all the first slits being provided so as not to overlap the first slits with a rung of the RF coil in a radial view, and
the RF shield is formed such that a length thereof in the axial direction is longer than a range in which conductor patterns are disposed on the RF coil, and further includes second slits formed on outside of a portion facing the range.

* * * * *